(12) United States Patent
Matsubara

(10) Patent No.: US 8,664,010 B2
(45) Date of Patent: Mar. 4, 2014

(54) SEMICONDUCTOR DEVICE AND MANUFACTURING METHOD OF THE SEMICONDUCTOR DEVICE

(75) Inventor: Yoshihisa Matsubara, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 292 days.

(21) Appl. No.: 12/929,966

(22) Filed: Feb. 28, 2011

(65) Prior Publication Data

US 2011/0241142 A1    Oct. 6, 2011

(30) Foreign Application Priority Data

Mar. 31, 2010   (JP) ................................ 2010-081070

(51) Int. Cl.
    *H01L 21/428*    (2006.01)
(52) U.S. Cl.
    USPC .. 438/3; 257/422; 257/E21.665; 257/E29.323
(58) Field of Classification Search
    USPC ............... 257/422, E21.665, E29.323; 438/3
    See application file for complete search history.

(56) References Cited

U.S. PATENT DOCUMENTS

| | | | |
|---|---|---|---|
| 6,661,071 B2 | 12/2003 | Lenssen et al. | |
| 6,806,524 B2 | 10/2004 | Ooishi | |
| 7,009,873 B2 | 3/2006 | Yoda et al. | |
| 7,088,610 B2 | 8/2006 | Tai | |
| 7,276,987 B2 * | 10/2007 | Koriyama | 333/26 |
| 7,790,612 B2 | 9/2010 | Nakamura et al. | |
| 8,018,045 B2 * | 9/2011 | En et al. | 257/700 |
| 2004/0077134 A1 * | 4/2004 | Takayama et al. | 438/151 |
| 2004/0155723 A1 * | 8/2004 | Koriyama | 333/26 |
| 2006/0113671 A1 * | 6/2006 | Isa et al. | 257/758 |
| 2007/0109681 A1 * | 5/2007 | Biskeborn et al. | 360/121 |
| 2008/0212240 A1 * | 9/2008 | Biskeborn et al. | 360/319 |
| 2009/0065909 A1 * | 3/2009 | Guo et al. | 257/659 |
| 2009/0135528 A1 * | 5/2009 | Biskeborn et al. | 360/317 |
| 2009/0309221 A1 * | 12/2009 | Ozaki et al. | 257/741 |
| 2012/0038012 A1 * | 2/2012 | Zhao et al. | 257/421 |
| 2012/0145551 A1 * | 6/2012 | Liu et al. | 205/103 |
| 2012/0205764 A1 * | 8/2012 | Chen et al. | 257/422 |

FOREIGN PATENT DOCUMENTS

| | | |
|---|---|---|
| JP | 1-220845 | 9/1989 |
| JP | 2004-503102(A) | 1/2004 |
| JP | 2004-228187 | 8/2004 |
| JP | 2004-297049 | 10/2004 |
| JP | 2004-363411 | 12/2004 |
| JP | 2007-95913(A) | 4/2007 |
| JP | 2007-123512(A) | 5/2007 |
| JP | 2008-091484 | 4/2008 |

OTHER PUBLICATIONS

Japanese Office Action dated Dec. 3, 2013 with English translation thereof, JP 2010-081070.

* cited by examiner

*Primary Examiner* — Allan R Wilson
(74) *Attorney, Agent, or Firm* — McGinn IP Law Group, PLLC

(57) ABSTRACT

An MTJ element is formed in a wiring layer located in a lower tier and yet application of heat to the MTJ element is suppressed. A first insulating layer is formed over a substrate. Subsequently, the MTJ element is formed over the first insulating layer. After that a first wiring is formed over the MTJ element. Thereafter, a second insulating layer is formed over the first wiring. Then a second wiring is formed in the superficial layer of the second insulating layer. The second wiring is heat treated by photoirradiation. A shield conductor is formed at the step of forming the second wiring.

11 Claims, 9 Drawing Sheets

SEMICONDUCTOR DEVICE AND MANUFACTURING METHOD OF THE SEMICONDUCTOR DEVICE

CROSS-REFERENCE TO RELATED APPLICATION

The disclosure of Japanese Patent Application No. 2010-81070 filed on Mar. 31, 2010 including the specification, drawings, and abstract is incorporated herein by reference in its entirety.

BACKGROUND

1. Field of the Invention

The present invention relates to a semiconductor device including an MTJ (Magnetic Tunnel Junction) element and a manufacturing method of the semiconductor device.

2. Description of Related Art

As one of nonvolatile memories, there are MRAMs (Magnetic Random Access Memories) including an MTJ element. In the MRAM, information is rewritten by changing the magnetization direction of a magnetic material layer provided in an MTJ element thereof. As described in Japanese Patent Application Publication No. 2004-297049, Japanese Patent Application Publication No. 2004-363411 and Japanese Patent Application Publication No. 2004-228187, at least one wiring layer may be formed over an MTJ element.

Japanese Patent Application Publication No. 2008-91484 describes that when heat is applied to an MTJ element, the MTJ element is deteriorated. In the technology described in Japanese Patent Application Publication No. 2008-91484, rate of temperature rise, back pressure, and the like as parameters of manufacturing conditions are controlled to predetermined conditions to suppress this deterioration.

Japanese Patent Application Publication No. Hei 1(1989)-220845 discloses that light for heat treatment is prevented from being applied to a predetermined area in a substrate by placing a mask with a predetermined mask pattern formed therein between a light source and the substrate.

SUMMARY

When a wiring layer is formed of a Cu wiring, usually, heat treatment is carried out at a wiring formation step. As mentioned above, however, application of heat to an MTJ element deteriorates the MTJ element. As one of methods for avoiding this deterioration in an MTJ element, the MTJ element could be formed in the uppermost wiring layer. In general, however, the uppermost wiring layer has a power supply line and a ground line. From the viewpoint of suppression of short-circuiting between power supply lines and suppression of increase in the current density for wirings in the uppermost wiring layer, the following design rule is applied to the wirings in the uppermost wiring layer: the wiring width and the wiring spacing are made larger than local wirings used for signal wirings in wiring layers located lower than the uppermost wiring layer. For this reason, when an MTJ element is formed in this wiring layer, the MTJ element cannot be microminiaturized.

Therefore, it is desired to make it possible to form an MTJ element in a wiring layer located lower than the uppermost wiring layer and yet suppress application of heat to the MTJ element.

According to an aspect of the present invention, a manufacturing method of a semiconductor device includes the following six steps: a first insulating layer formation-step, an MTJ element formation-step, a first wiring formation-step, a second insulating layer formation-step, a second wiring formation-step, and heat-treating step. In the first insulating layer formation-step, a first insulating layer over a substrate is formed. In the MTJ element formation-step, an MTJ element is formed over the first insulating layer. In the first wiring formation-step, a first wiring coupled to the MTJ element is formed over the MTJ element. In the second insulating layer formation-step, a second insulating layer is formed over the first wiring. In the second wiring formation-step, a second wiring is formed in the surface layer of the second insulating layer. In the heating-treating step, the second wiring is heated by photoirradiation.

In the first wiring formation-step or the second wiring formation-step, a shield conductor region covering the entire MTJ element is formed in plan view.

According to the one aspect of the invention, a shield conductor region is formed over an MTJ element. The shield conductor region covers the entire MTJ element in plan view. For this reason, when a second wiring is heated by photoirradiation, heating the MTJ element with photoirradiation is suppressed. Therefore, degradation of the MTJ element by heat treatment in the wiring formation step is suppressed.

According to another aspect of the present invention, a semiconductor device includes: a substrate, a multilayer wiring layer formed over the substrate, an MTJ element formed in an insulating layer located lower than the uppermost wiring layer in the multilayer wiring layer, a wiring formed in a wiring layer immediately above the MTJ element and coupled to the MTJ element; and a shield conductor region provided in the wiring or a wiring layer immediately above the wiring and covering the entire MTJ element in plan view.

According to the above aspect of the invention, it is possible to form an MTJ element in an insulating layer located lower than the uppermost wiring layer and yet suppress application of heat to the MTJ element.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
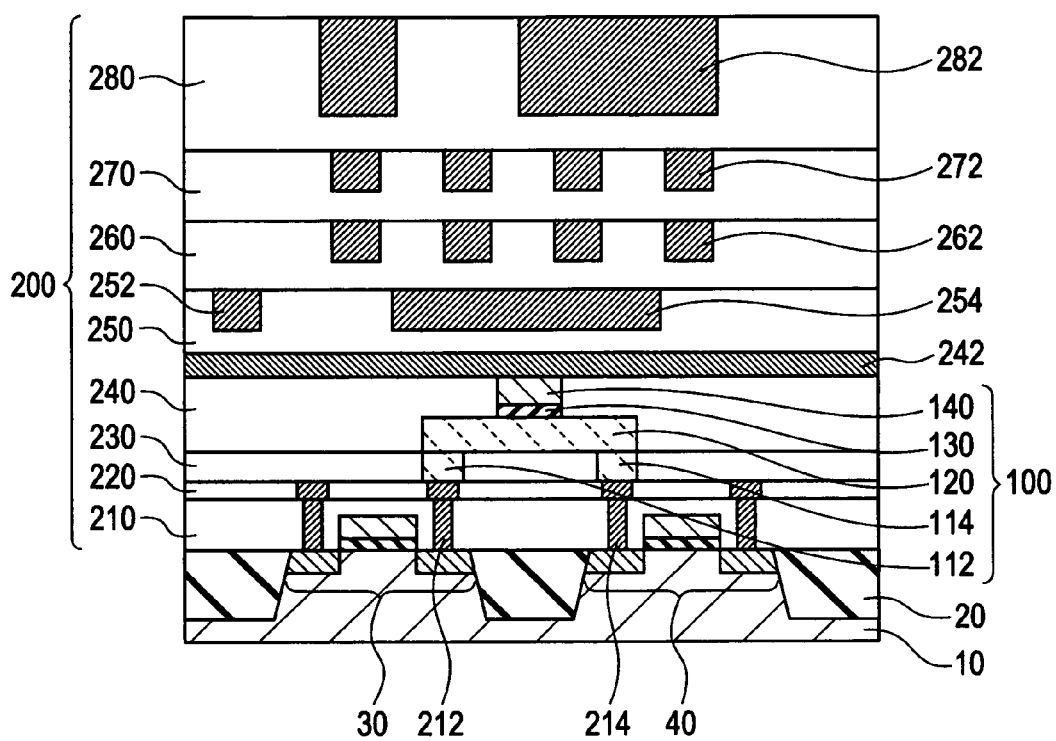
FIG. 1 is a sectional view illustrating the configuration of a semiconductor device in a first embodiment.

Hereafter, description will be given to embodiments of the invention with reference to the drawings. In all the drawings, the same constituent elements will be marked with the same reference numerals and the description thereof will be omitted as appropriate. Those skilled art will recognize that many alternative embodiments can be accomplished using the teachings of the present invention and that the invention is not limited to the embodiments illustrated for explanatory purposes.

FIG. 1 is a sectional view illustrating the configuration of a semiconductor device in a first embodiment. This semiconductor device includes a substrate 10, a multilayer wiring layer 200, an MTJ element 100, a wiring (first wiring (layer)) 242, and a shield conductor (shield conductor region) 254. The substrate 10 is, for example, a semiconductor substrate such as a silicon substrate but it is not limited thereto. The multilayer wiring layer 200 is formed over the substrate 10. The MTJ element 100 is formed in an insulating layer located lower than the uppermost wiring layer (282) in the multilayer wiring layer 200. The wiring 242 is formed in a wiring layer immediately above the MTJ element 100 and coupled to the MTJ element 100. The shield conductor 254 is provided in a wiring layer immediately above the wiring 242 and covers the entire MTJ element 100 as viewed in a plane.

In this embodiment, the MTJ element 100 is a magnetic-domain-wall displacement-type element and is so structured that spin absorption layers 112, 114, a domain wall displacement layer 120, a tunnel barrier layer 130, and a pin layer 140 are laminated in this order. The planar shape of the domain wall displacement layer 120 is rectangular. The upper surface of the spin absorption layer 112 is coupled to one end of the lower surface of the domain wall displacement layer 120; and the upper surface of the spin absorption layer 114 is coupled to the other end of the lower surface of the domain wall displacement layer 120. The tunnel barrier layer 130 and the pin layer 140 are coupled to the central part of the upper surface of the domain wall displacement layer 120. The spin absorption layers 112, 114, domain wall displacement layer 120, and pin layer 140 are formed of a magnetic material layer of, for example, CoFe and the tunnel barrier layer 130 is formed of a thin insulating layer of, for example, $Al_2O_3$ or MgO.

The lower surface of the spin absorption layer 112 is coupled to a diffusion layer to be the source or drain of a transistor 30 through a via 212; and the lower surface of the spin absorption layer 114 is coupled to a diffusion layer to be the source or drain of a transistor 40 through a via 214. The transistors 30, 40 are formed in the substrate 10 and carry out write processing to the MTJ element 100 and read processing from the MTJ element 100.

The vias 212, 214 are buried in an insulating layer 210 and coupled to the spin absorption layers 112, 114 through a conductor pattern buried in an insulating layer 220. The spin absorption layers 112, 114 are buried in an insulating layer 230. The domain wall displacement layer 120, tunnel barrier layer 130, and pin layer 140 are buried in an insulating layer 240. The wiring (wiring layer) 242 is formed over the insulating layer 240. The upper surface of the pin layer 140 is not covered with the insulating layer 240 and is coupled to the wiring 242. The wiring 242 is formed of, for example, W or TiN. The wiring 242 is supplied with ground potential.

However, the wiring 242 may be formed of Cu. In this case, the wiring 242 is formed by a damascene method and is buried in the insulating layer 240. For this reason, the upper surface of the wiring 242 and the upper surface of the insulating layer 240 form an identical plane.

An insulating layer 250 is formed over the wiring (wiring layer) 242 and the insulating layer 240. The shield conductor 254 and a wiring 252 (second wiring) are buried in the superficial layer of the insulating layer 250 using a damascene method. The wiring layer comprising both shield conductor 254 and the wiring 252 is formed of Cu. The shield conductor 254 is electrically floating and is not coupled to any of the wirings or the vias.

Insulating layers 260, 270, 280 are laminated in this order over the wiring 252, shield conductor 254, and insulating layer 250. A wiring 262 is buried in the superficial layer of the insulating layer 260 and a wiring 272 is buried in the superficial layer of the insulating layer 270. A wiring 282 is formed in the insulating layer 280. The wirings 262, 272, 282 are formed of Cu using, for example, a damascene method. In the example illustrated in this drawing, the insulating layer 280 comprising the wiring layer in the uppermost tier is so formed that it is thicker than the insulating layers comprising the other wiring layers. The wiring 282 in the uppermost wiring layer formed in the insulating layer 280 is wider in width and placement spacing than at least the wiring 252. The wiring 282 is, for example, a ground line or a power supply line.

Each insulating layer mentioned above may have a single layer structure or have a laminated structure obtained by laminating multiple layers. The laminar structure of the multilayer wiring layer 200 is not limited to the example illustrated in FIG. 1.

Figure 2:
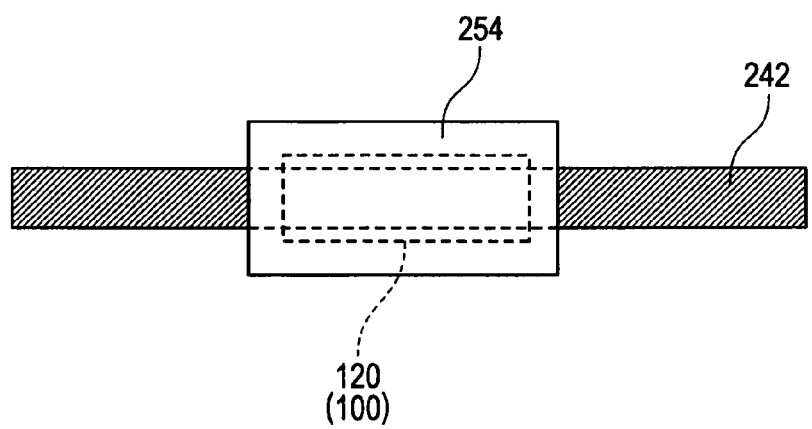
FIG. 2 is a plan view illustrating the planar layout of an MTJ element, a wiring, and a shield conductor.

FIG. 2 is a plan view illustrating the planar layout of the MTJ element 100, wiring 242, and shield conductor 254. As illustrated in FIG. 1 and FIG. 2, the domain wall displacement layer 120 is largest in planar shape in the MTJ element 100. As illustrated in this drawing, the shield conductor 254 embraces the entire domain wall displacement layer 120, that is, the entire MTJ element 100 therein as viewed in a plane. For this reason, the entire MTJ element 100 is covered with the shield conductor 254 as viewed in a plane.

Figure 3:
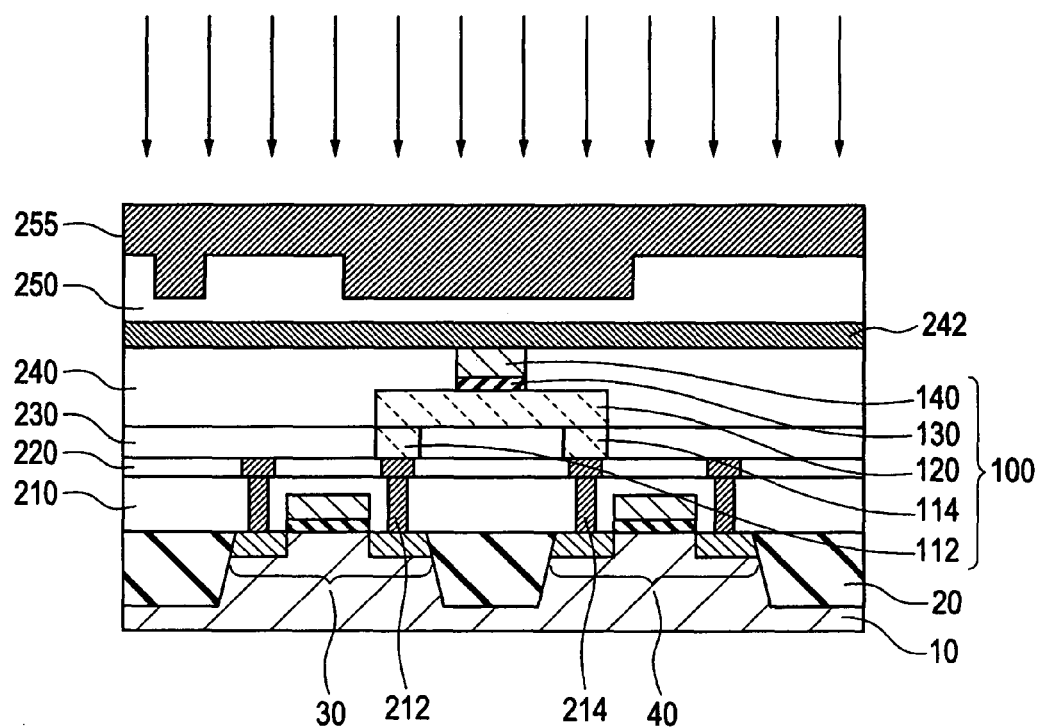
FIG. 3 is a sectional view illustrating a manufacturing method of the semiconductor device illustrated in FIG. 1.
Figure 4:
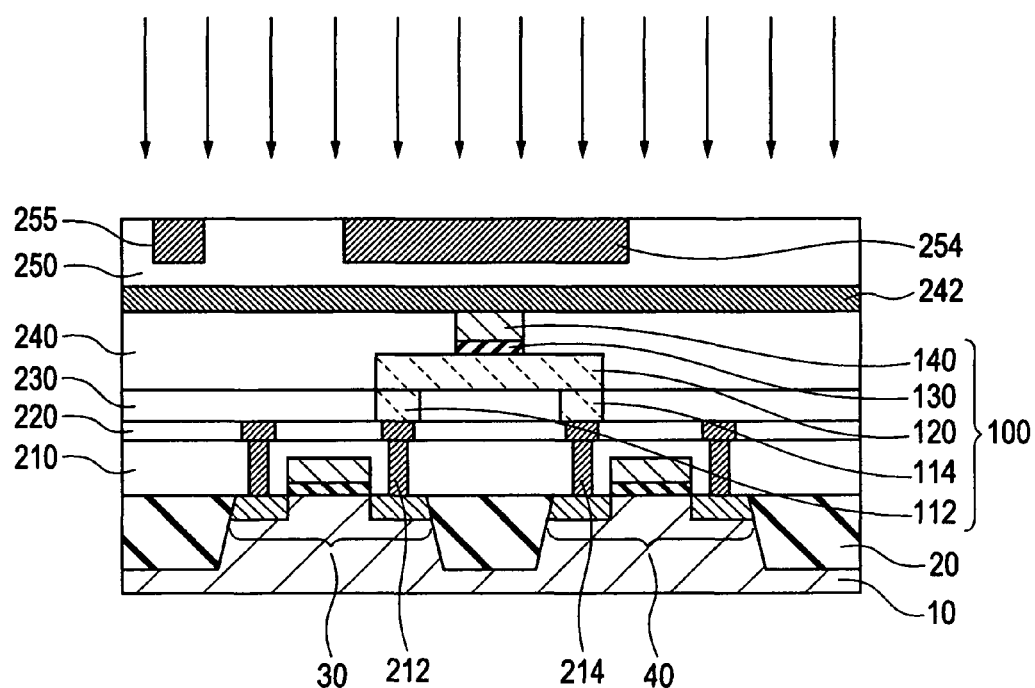
FIG. 4 is a sectional view illustrating the manufacturing method of the semiconductor device illustrated in FIG. 1.
Figure 5:
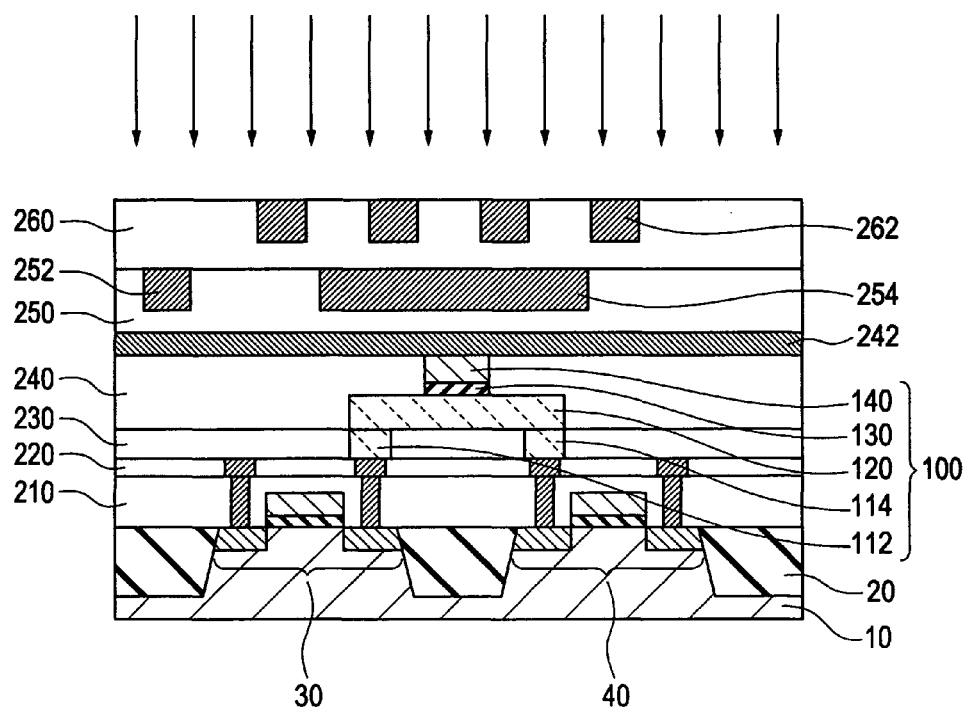
FIG. 5 is a sectional view illustrating the manufacturing method of the semiconductor device illustrated in FIG. 1.

FIG. 3, FIG. 4, and FIG. 5 are sectional views illustrating a manufacturing method of the semiconductor device illustrated in FIG. 1. This manufacturing method of the semiconductor device includes the following steps. First, the insulating layer 210 and the insulating layer 220 (first insulating layer) are formed over the substrate 10. Subsequently, the MTJ element 100 is formed over the insulating layer 220. After that, the wiring 242 is formed over the MTJ element 100. Then the insulating layer (second insulating layer) 250 is formed over the wiring 242. Thereafter, the wiring 252 is formed in the superficial layer of the insulating layer 250. Next, the wiring 252 is heat treated by photoirradiation. At the step of forming the wiring 252, the shield conductor 254 is formed. Detailed description will be given below.

First, as illustrated in FIG. 3, an element isolation region 20 and the transistors 30, 40 are formed in the substrate 10. Subsequently, the insulating layers 210, 220 are formed over the element isolation region 20 and the transistors 30, 40 and the vias 212, 214 and a conductor pattern are buried in the insulating layers 210, 220.

Subsequently, a magnetic material layer is formed over the insulating layer 220 by a sputtering method and this magnetic material layer is selectively removed. As a result, the spin absorption layers 112, 114 are formed. Then the insulating layer 230 is formed over the insulating layer 220 and the spin absorption layers 112, 114. At this step, the insulating layer 230 also covers the spin absorption layers 112, 114. Thereafter, the superficial layer of the insulating layer 230 is polished and removed by a CMP method. As the result of this step, the upper surfaces of the spin absorption layers 112, 114 are exposed from the insulating layer 230.

Subsequently, a magnetic material layer is formed over the insulating layer 230 and the spin absorption layers 112, 114 by a sputtering method and an unnecessary part of this magnetic material layer is removed by dry etching or the like. As a result, the domain wall displacement layer 120 is formed.

Subsequently, an insulating layer is formed over the domain wall displacement layer 120 and the insulating layer 230 and further a magnetic material layer is formed over this insulating layer by a sputtering method. After that, an unnecessary part of the laminated film of this insulating layer and the magnetic material layer is removed by dry etching or the like. As a result, the tunnel barrier layer 130 and the pin layer 140 are formed.

Subsequently, the insulating layer 240 is formed over the insulating layer 230 and the domain wall displacement layer 120. At this step, the insulating layer 240 also covers the pin layer 140. Thereafter, the surface of the insulating layer 240 is ground by a CMP method. As the result of this step, the upper surface of the pin layer 140 is exposed from the insulating layer 240.

Subsequently, a conductive film is formed over the insulating layer 240 and the pin layer 140 by a sputtering method and an unnecessary part is removed so that this conductive film is shaped as predetermined. As a result, the wiring (wiring layer) 242 is formed over the insulating layer 240 and the pin layer 140.

Subsequently, the insulating layer 250 is formed over the insulating layer 240, over the pin layer 140, and over the wiring 242. After that, a groove for burying the wiring (wiring layer) 252 and a groove for burying the shield conductor 254 are formed in the insulating layer 250. Thereafter, a plating seed film is formed in the superficial layers of the inner walls and bottoms of these grooves and the insulating layer 250 by a sputtering method. Then plating is carried out with this plating seed film used as a seed. As a result, a plating film 255 to be the wiring 252 and the shield conductor 254 is formed. The plating film 255 is formed of Cu.

Subsequently, the plating film 255 is irradiated with light and thereby heat treated. This heat treatment is, for example, lamp anneal treatment. At this step, the plating film 255 has been formed all over and thus the light for heat treatment does not arrive at the MTJ element 100. Therefore, application of heat to the MTJ element 100 is suppressed.

Subsequently, as illustrated in FIG. 4, the plating film 255 positioned over the insulating layer 250 is polished and removed by a CMP method. As a result, the wiring 252 and the shield conductor 254 are buried in the superficial layer of the insulating layer 250. After that, the wiring 252 and the shield conductor 254 are irradiated with light and thereby heat treated. This heat treatment is, for example, lamp anneal treatment. As mentioned above, the entire MTJ element 100 is covered with the shield conductor 254 as viewed in a plane. For this reason, the light for heat treatment does not arrive at the MTJ element 100 at this step. Therefore, application of heat to the MTJ element 100 is suppressed.

Subsequently, as illustrated in FIG. 5, the insulating layer 260 is formed over the insulating layer 250, over the wiring 252, and over the shield conductor 254. After that, the wiring 262 is buried in the superficial layer of the insulating layer 260. This step is the same as the step of burying the wiring 252 and the shield conductor 254 in the superficial layer of the insulating layer 250. After the wiring 262 is buried in the superficial layer of the insulating layer 260, the wiring 262 is irradiated with light and thereby heat treated. As mentioned above, the MTJ element 100 is covered with the shield conductor 254 as viewed in a plane. For this reason, the light for heat treatment does not arrive at the MTJ element 100 at this step. Therefore, application of heat to the MTJ element 100 is suppressed.

Thereafter, as illustrated in FIG. 1, the insulating layer 270 and the wiring 272 are formed. This step is the same as the step of burying the wiring 252 and the shield conductor 254 in the superficial layer of the insulating layer 250. After the wiring 272 is buried in the superficial layer of the insulating layer 270, the wiring 272 is irradiated with light and thereby heat treated. Also at this step, the light for heat treatment does not arrive at the MTJ element 100.

Subsequently, the insulating layer 280 and the wiring (wiring layer) 282 are formed. This step is the same as the step of burying the wiring 252 and the shield conductor 254 in the superficial layer of the insulating layer 250. After the wiring 282 is buried in the superficial layer of the insulating layer 280, the wiring 282 is irradiated with light and thereby heat treated. Also at this step, the light for heat treatment does not arrive at the MTJ element 100.

Description will be given to the action and effect of this embodiment. In this embodiment, a step of heat treating a wiring is carried out by photoirradiation, for example, lamp anneal. In the tier immediately above the wiring 242 coupled to the MTJ element 100, there is formed the shield conductor 254. The shield conductor 254 covers the entire MTJ element 100 as viewed in a plane. For this reason, the light for heat treatment is blocked by the shield conductor 254 and does not arrive at the MTJ element 100. Therefore, it is possible to suppress the MTJ element 100 from being deteriorated by heat.

In this embodiment, especially, the shield conductor 254 is formed in the wiring layer which is the superficial layer of the insulating layer 250 immediately above the MTJ element 100. Therefore, the distance between the shield conductor 254 and the MTJ element 100 can be reduced. For this reason, it is also possible to suppress heat for heat treatment from taking a roundabout path and being applied to the MTJ element 100.

The shield conductor 254 is formed at the same step as the wiring 252 is. For this reason, it is unnecessary to add a step for forming the shield conductor 254 and thus increase in the manufacturing cost of the semiconductor device can be suppressed.

Figure 6:
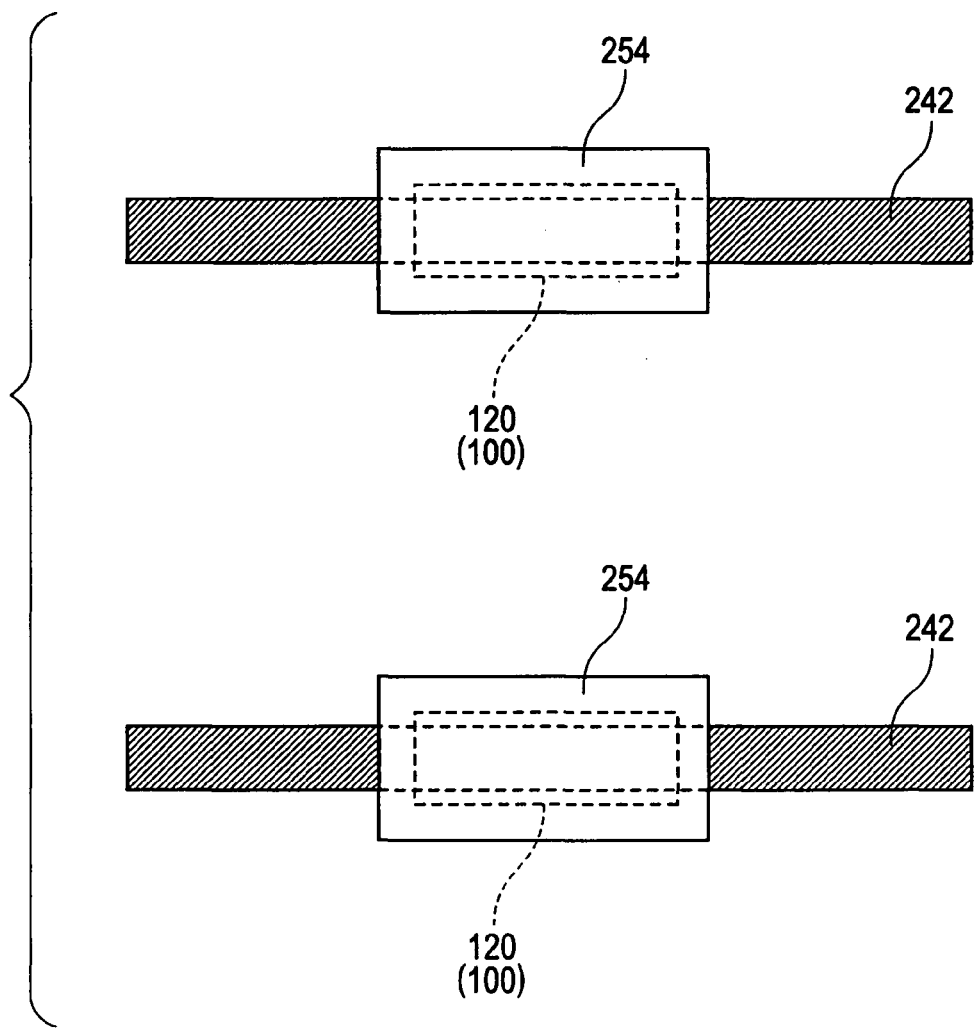
FIG. 6 is a plan view illustrating the configuration of a semiconductor device in a second embodiment.

FIG. 6 is a plan view illustrating the configuration of a semiconductor device in a second embodiment and corresponds to FIG. 2 in relation to the first embodiment. The semiconductor device shown in this drawing includes multiple MTJ elements 100. The shield conductor 254 is provided for each of the MTJ elements 100.

Also in this embodiment, the same effect as in the first embodiment can be obtained.

Figure 7:
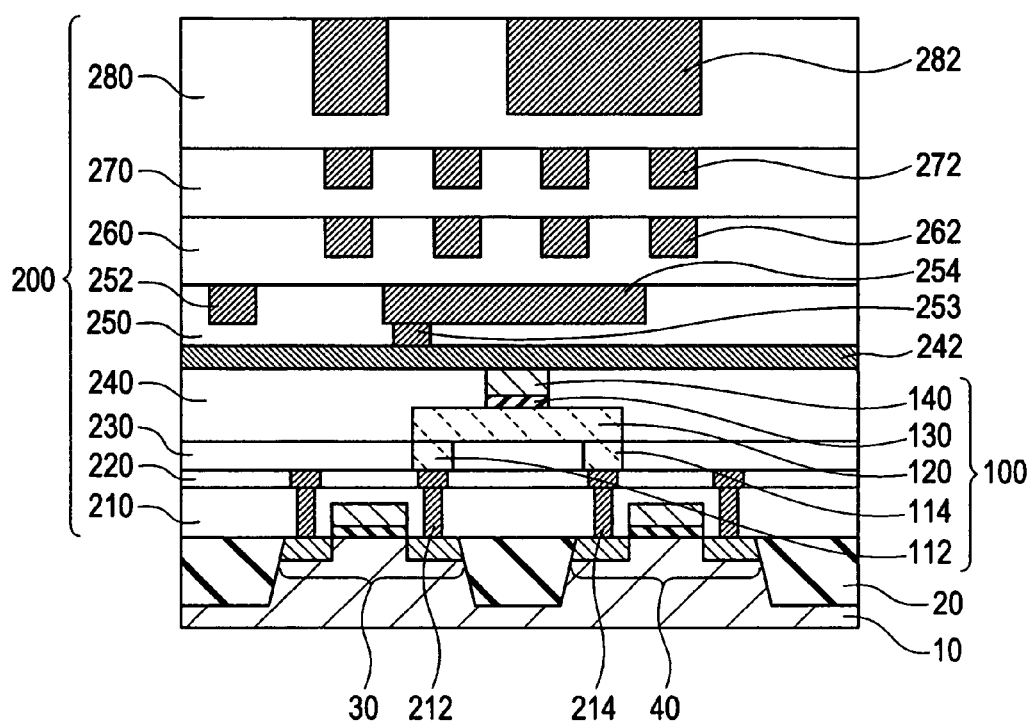
FIG. 7 is a sectional view illustrating the configuration of a semiconductor device in a third embodiment.

FIG. 7 is a sectional view illustrating the configuration of a semiconductor device in a third embodiment. The configuration of this semiconductor device is the same as that of the semiconductor device in the first or second embodiment, except that the shield conductor 254 is coupled to the wiring 242 through a via 253. The via 253 is buried in the insulating layer 250 and is formed at the same step as the step of forming a via (not shown) that couples the wiring 252 to a wiring layer located lower than the uppermost wiring layer.

Also in this embodiment, the same effect as in the first embodiment can be obtained. Since the wiring 242 is supplied with ground potential, the shield conductor 254 is also supplied with ground potential. For this reason, the MTJ element 100 can be protected from external noise by the shield conductor 254. The structure for supplying ground potential to the shield conductor 254 is not limited to the structure in this embodiment.

Figure 8:
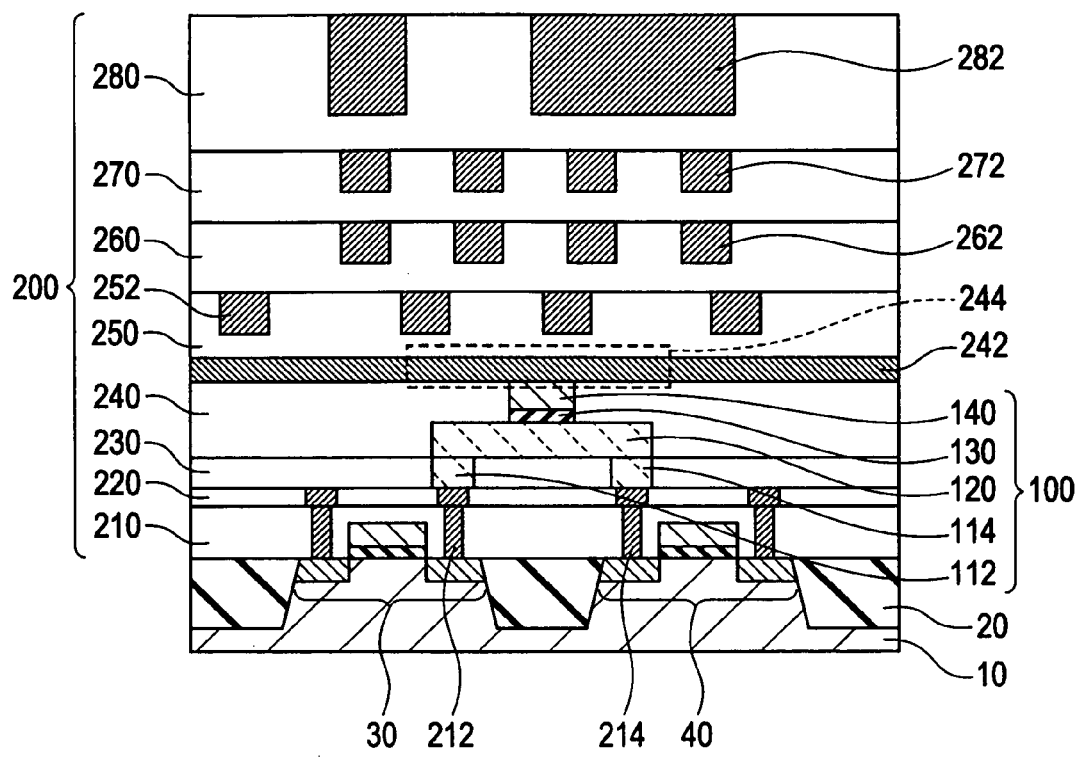
FIG. 8 is a sectional view illustrating the configuration of a semiconductor device in a fourth embodiment.

FIG. 8 is a sectional view illustrating the configuration of a semiconductor device in a fourth embodiment and corresponds to FIG. 1 in relation to the first embodiment. The configuration of the semiconductor device in this embodiment is the same as that of the semiconductor device in the first or second embodiment except the following points:

The semiconductor device in this embodiment does not have the shield conductor 254. The wiring 252 is provided in an area where the shield conductor 254 is otherwise provided, that is, an area in the insulating layer 250 that overlaps with the MTJ element 100 as viewed in a plane.

The wiring 242 is provided with a shield region 244. The shield region 244 is an example of shield conductor region and is provided to suppress application of light for heat treatment to the MTJ element 100. In this embodiment, in other words, the shield region 244 as a shield conductor region is formed as part of the wiring 242 at the step of forming the wiring 242.

Figure 9:
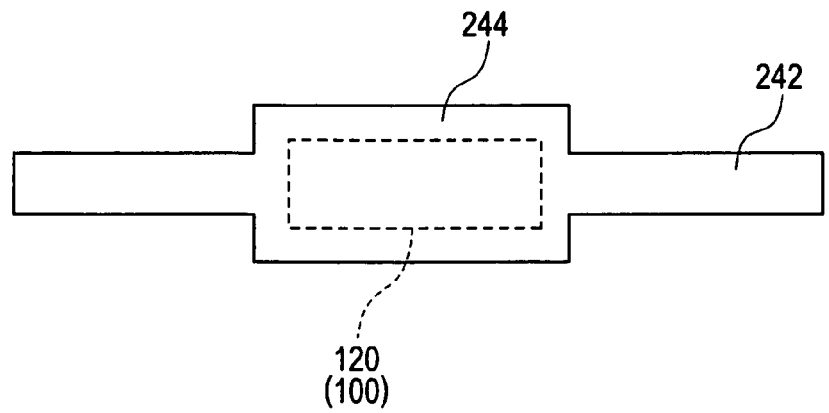
FIG. 9 is a plan view illustrating the layout of a shield region in the semiconductor device illustrated in FIG. 8.

FIG. 9 is a plan view illustrating the layout of the shield region 244 in the semiconductor device illustrated in FIG. 8. The shield region 244 is wider than the other areas in the wiring 242 and covers the entire MTJ element 100 as viewed in a plane.

The manufacturing method of the semiconductor device in this embodiment is the same as that of the semiconductor device in the first embodiment.

Also in this embodiment, the shield region 244 blocks light for heat treatment and the light for heat treatment does not arrive at the MTJ element 100. Therefore, the same effect as in the first embodiment can be obtained.

Since the shield conductor 254 is not provided, the wiring 252 can be placed in an area in the insulating layer 250 where it overlaps with the MTJ element 100 as viewed in a plane. This enhances the degree of freedom in the layout of the wiring 252 in the superficial layer of the insulating layer 250.

Since the wiring 242 and the shield region 244 are supplied with ground potential, the MTJ element 100 can be protected from external noise by the shield region 244.

Figure 10:
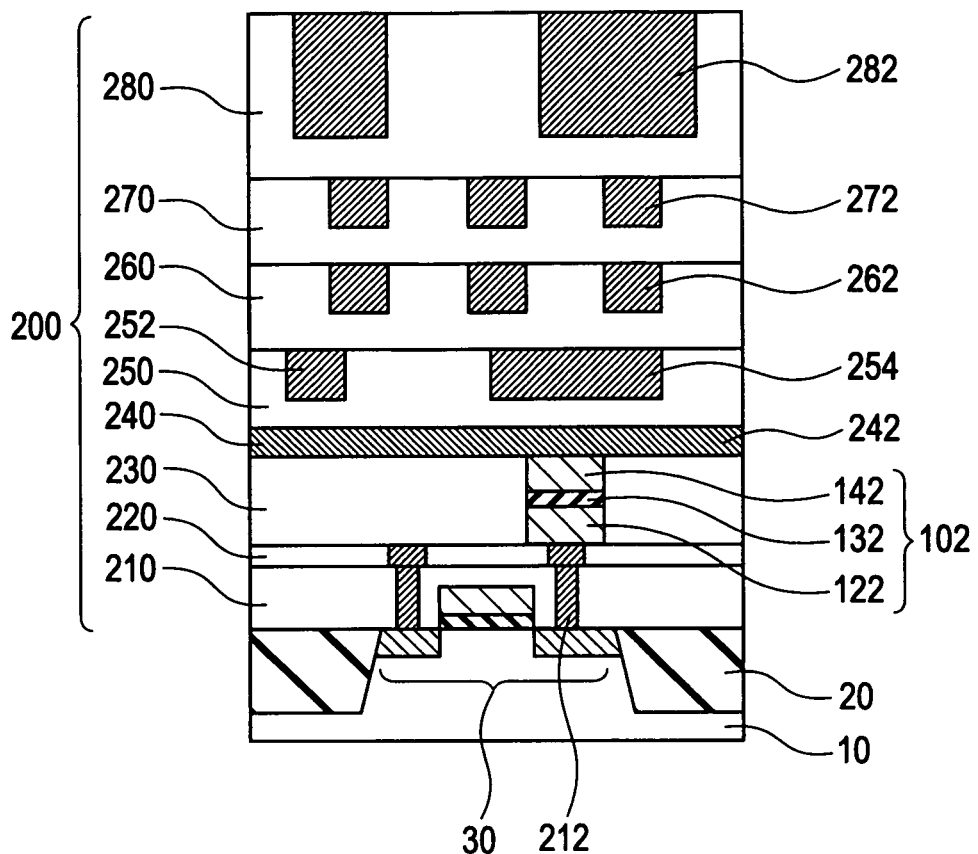
FIG. 10 is a sectional view illustrating the configuration of a semiconductor device in a fifth embodiment.

FIG. 10 is a sectional view illustrating the configuration of a semiconductor device in a fifth embodiment. The configuration of this semiconductor device is the same as that of the semiconductor device in the first or second embodiment, except that an MTJ element 102 is provided in place of the MTJ element 100 and the transistor 40 is not provided.

The MTJ element 102 is a spin torque injection MTJ element and is configured by laminating the pin layer 122, the tunnel barrier layer 132, and a variable spin layer 142 in this order. The pin layer 122 and the variable spin layer 142 is formed of a magnetic material layer of, for example, CoFe and the tunnel barrier layer 132 is formed of a thin insulating layer of, for example, $Al_2O_3$ or MgO. The pin layer 122 is coupled to a diffusion layer to be the source or drain of the transistor 30 through the via 212 and the upper surface of the variable spin layer 142 is coupled to the wiring 242.

The MTJ element 102 is formed as follows, for example. First, a magnetic material layer, an insulating layer, and a magnetic material layer are laminated over the insulating layer 220. Subsequently, this laminated film is selectively removed. As a result, the MTJ element 102 is formed.

Figure 11:
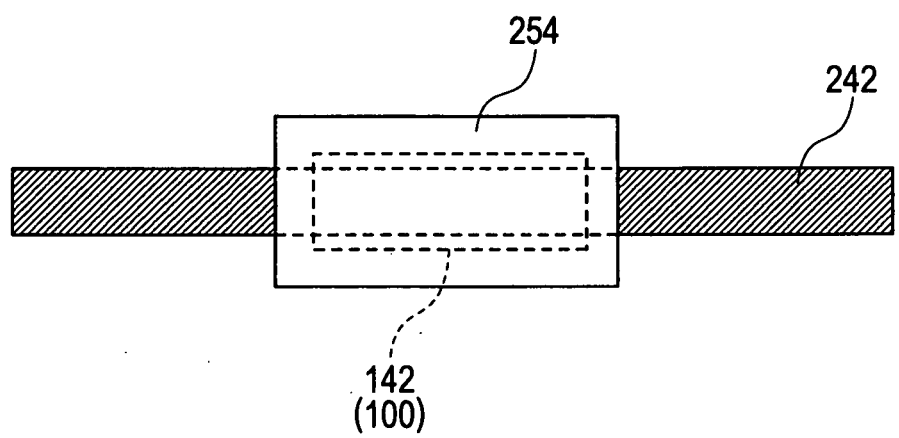
FIG. 11 is a plan view illustrating the positional relation between an MTJ element and a shield conductor in the semiconductor device illustrated in FIG. 10.

FIG. 11 is a plan view illustrating the positional relation between the MTJ element 102 and the shield conductor 254 in the semiconductor device illustrated in FIG. 10. As illustrated in this drawing, the MTJ element 102 is also entirely covered with the shield conductor 254.

For this reason, also in this embodiment, the same effect as in the first embodiment can be obtained. In this embodiment, the via 253 may be provided as in the third embodiment. In this case, the same effect as in the third embodiment can be obtained.

Figure 12:
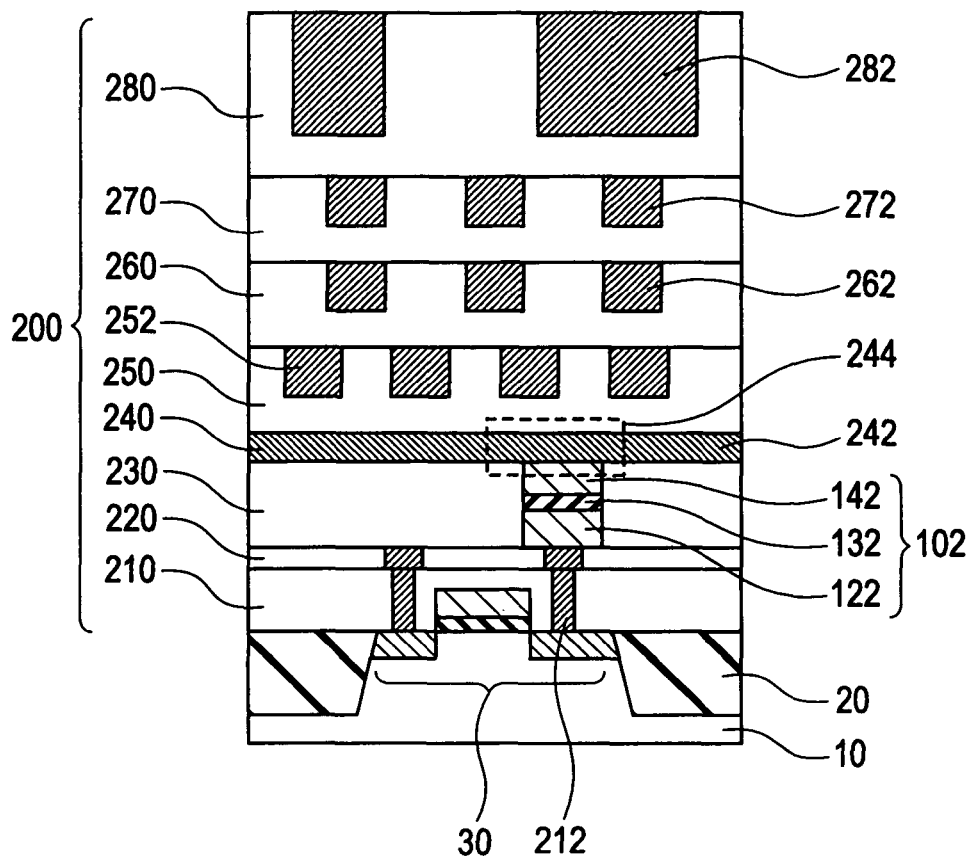
FIG. 12 is a sectional view illustrating the configuration of a semiconductor device in a sixth embodiment.

FIG. 12 is a sectional view illustrating the configuration of a semiconductor device in a sixth embodiment. This semiconductor device is the same as the semiconductor device in the fifth embodiment except the following points:

The semiconductor device in this embodiment does not have the shield conductor 254. In this embodiment, the wiring 252 is also provided in an area where the shield conductor 254 is provided in the fifth embodiment, that is, an area in the insulating layer 250 that overlaps with the MTJ element 102 as viewed in a plane.

Further, the wiring 242 is provided with the shield region 244. The shield region 244 is provided to suppress application of light for heat treatment to the MTJ element 100.

Figure 13:
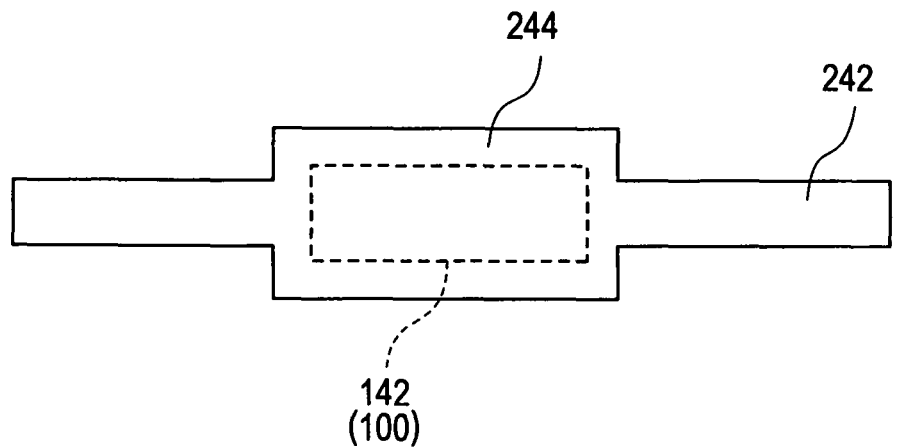
FIG. 13 is a plan view illustrating the positional relation between an MTJ element and a shield region in the semiconductor device illustrated in FIG. 12.

FIG. 13 is a plan view illustrating the positional relation between the MTJ element 102 and the shield region 244 in the semiconductor device illustrated in FIG. 12. As illustrated in this drawing, the shield region 244 covers the entire MTJ element 102 as viewed in a plane.

For this reason, also in this embodiment, the same effect as in the fifth embodiment can be obtained.

Since the shield conductor 254 is not provided, the wiring 252 can be placed in an area in the insulating layer 250 where it overlaps with the MTJ element 102 as viewed in a plane. This enhances the degree of freedom in the layout of the wiring 252 in the superficial layer of the insulating layer 250.

Since the wiring 242 and the shield region 244 are supplied with ground potential, the MTJ element 100 can be protected from external noise by the shield region 244.

Up to this point, description has been given to embodiments of the invention with reference to the drawings. However, these embodiments are just examples of the invention and various configurations other than above can be adopted. For example, the manufacturing method of the MTJ elements 100, 102 is not limited to the above-mentioned example.

What is claimed is:

1. A manufacturing method of a semiconductor device, the method comprising:
   forming a first insulating layer over a substrate;
   forming an MTJ (Magnetic Tunnel Junction) element over the first insulating layer;
   forming a first wiring coupled to the MTJ element over the MTJ element;
   forming a second insulating layer over the first wiring;
   forming a second wiring in a superficial layer of the second insulating layer; and
   heating the second wiring by photoirradiation,
   wherein, in the forming the first wiring or the forming the second wiring, a shield conductor region, separate from the first wiring and the second wiring, covering an entirety of the MTJ element in a plan view is formed.

2. The manufacturing method of the semiconductor device according to claim 1, further comprising:
   after the forming the second wiring, forming a third wiring over the second insulating layer.

3. The manufacturing method of the semiconductor device according to claim 2, wherein after the forming the third wiring, a heat treatment is carried out by photoirradiation.

4. The manufacturing method of the semiconductor device according to claim 1, wherein the shield conductor region is formed as part of the first wiring in the forming the first wiring.

5. The manufacturing method of the semiconductor device according to claim 4, wherein the first wiring and the shield conductor region comprise TiN, or W.

6. The manufacturing method of the semiconductor device according to claim 1, wherein the shield conductor region is formed in a wiring layer in which the second wiring is formed in the forming the second wiring.

7. The manufacturing method of the semiconductor device according to claim 1, wherein the second wiring comprises Cu.

8. The manufacturing method of the semiconductor device according to claim 1, wherein the shield conductor region is formed in a same layer in which the second wiring is formed.

9. The manufacturing method of the semiconductor device according to claim 1, wherein the shield conductor region and the second wiring are disposed in the superficial layer of the second insulating layer.

10. The manufacturing method of the semiconductor device according to claim 1, wherein the forming the second insulating comprises disposing the second insulating layer on a surface of the first wiring layer.

11. The manufacturing method of the semiconductor device according to claim 10, wherein the shield conductor region and the second wiring are disposed in the second insulating layer.

* * * * *